United States Patent [19]
Roberts

[11] Patent Number: 4,601,016
[45] Date of Patent: Jul. 15, 1986

[54] SEMICONDUCTOR MEMORY CELL
[75] Inventor: Peter C. Roberts, Plymouth, Minn.
[73] Assignee: Honeywell Inc., Minneapolis, Minn.
[21] Appl. No.: 507,617
[22] Filed: Jun. 24, 1983
[51] Int. Cl.[4] ............................................. G11C 11/36
[52] U.S. Cl. .................................. 365/175; 365/189; 365/190
[58] Field of Search ............... 365/154, 174, 175, 189, 365/190

[56] References Cited
U.S. PATENT DOCUMENTS

| | | | |
|---|---|---|---|
| 3,564,300 | 2/1971 | Henle | 365/189 |
| 3,703,709 | 11/1972 | Matsue | 365/154 |
| 3,886,531 | 5/1975 | McNeill | 365/189 |
| 4,193,127 | 3/1980 | Gersbach | 365/154 |
| 4,279,023 | 7/1981 | Houghton | 365/174 |
| 4,280,198 | 7/1981 | Hueber et al. | 365/203 |
| 4,330,853 | 5/1982 | Heimeier et al. | 365/227 |

OTHER PUBLICATIONS

"Session XVII: Random Access Memories" *IEEE 1980 Int'l Solid-State Circuits Conference*, pp. 222-224, 276, S. K. Wiedmann, et al.
"Session XII: Memory Techniques" *IEEE 1981 Int'l Solid-State Circuits Conference*, pp. 158-159, 268, S. K. Wiedmann and D. D. Tang.

*Primary Examiner*—Terrell W. Fears
*Attorney, Agent, or Firm*—William T. Udseth

[57] ABSTRACT

A high density, low power dissipating semiconductor memory cell is provided by connecting first and second inputs of a means for maintaining current in one of two conditions to first and second bit lines, by first and second diodes, respectively. Conveniently, the means for maintaining the current in one of two conditions includes first and second transistors operating in the normal current mode. Standby current is provided to the base of the first transistor through the first bit line and first diode, and to the base of the second transistor through the second bit line and second diode.

22 Claims, 10 Drawing Figures

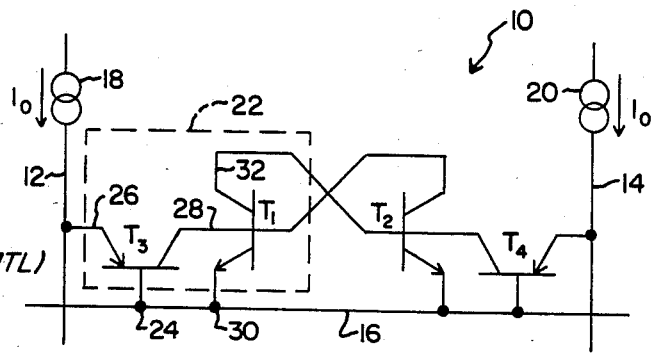
FIG. 1 PRIOR ART (I²L/MTL)
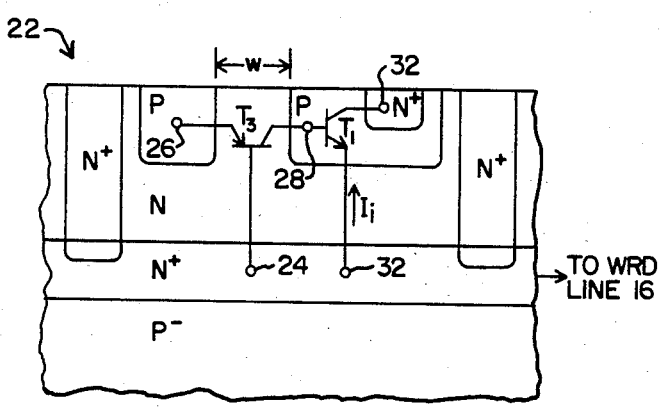
FIG. 2 PRIOR ART (I²L/MTL)
FIG. 3 PRIOR ART (ISL)
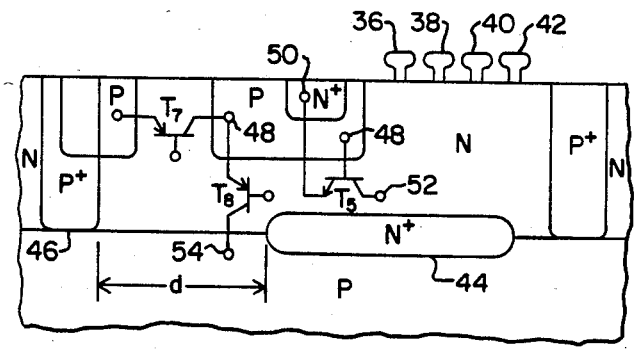
FIG. 4 PRIOR ART (ISL)

SEMICONDUCTOR MEMORY CELL

BACKGROUND OF THE INVENTION

1. Field of the Invention

This invention relates to bipolar memory cells employing merged transistor logic (MTL) in the form of modified integrated Schottky logic (ISL).

2. Prior Art

S. K. Wiedmann et al in "Session XVII: Random Access Memories", ISSCC (IEEE Feb. 15, 1980) and "Session XII: Memory Techniques" ISSCC (IEEE Feb. 19, 1981) have disclosed the structure and use of high density static memories with extremely low power dissipation using integrated injection logic/merged transistor logic ($I^2$ L/MTL).

FIGS. 1 and 2 depict the basic Wiedmann et al cell 10 (including bit lines 12 and 14, and word line 16) in schematic and cross section, respectively. As FIG. 1 shows, Wiedmann et al succeeded in eliminating resistors from cell 10 and feeding cell 10 with power through bit lines 12 and 14 (power flow is shown by current sources 18 and 20). The absence of resistors in the basic cell affords high packing density since resistors require physically distinct regions from the active device regions of cell 10 transistors $T_1$ and $T_2$.

Further, in order to keep the power dissipated by static cell 10 low, the standby current must be very low. For a given supply voltage, this implies a need for a very high resistance (i.e. at least megahoms or possibly $10^{12}$ ohms) to minimize the standby current, which in turn requires large chip areas due to limitations on the sheet resistance of materials.

Feeding power and current to the cells through the bit lines allows two resistors (i.e., the resistances associated with current sources 18 and 20) to serve the same function for an entire column of memory cells as the resistors (not shown) normally included in each memory cell. This allows reduction of the overall size of the semiconductor memory for a given supply voltage as compared to memories where each cell includes its own power supply, while keeping the power dissipated the same.

Wiedmann et al provide power to $T_1$ and $T_2$ by using current injecting transistors $T_3$ and $T_4$. Transistors $T_1$ and $T_3$ form a first half of cell 10 (marked by dashed line 22). Likewise transistors $T_2$ and $T_4$ form the second half of cell 10, both halves being identical.

Each pair of transistors (i.e., $T_1$ and $T_3$, and $T_2$ and $T_4$) are connected in $I^2$ L/MTL configuration. This configuration is well known. $T_1$ and $T_2$ are connected with their collector and base regions in the familiar cross-coupled relationship to provide a bistable, regenerative circuit. However for $I^2$ L, $T_1$ and $T_2$ operate in the inverse mode (i.e., current flow is in the direction which affords low current gain as contrasted with the normal or forward mode where current flows in the direction which affords high current gain). Processing of $I^2$L transistor configurations is more limited than the processing of configurations where the resulting transistors operate in the forward current mode because of the restrictions on doping profiles for $I^2$L.

The cross section in FIG. 2 includes only the first half of cell 10 marked by line 22. The base, emitter and collector regions of $T_1$ and $T_3$ are similarly numbered in FIGS. 1 and 2. Current $I_f$ represents the inverse current flow in $T_1$. As is well known, the current gain $\beta$ (i.e, collector current divided by base current) of a semiconductor transistor operating in the inverse mode is on the order of 2 to 10. However, $\beta$ for a transistor operating with normal or forward current flow is on the order of 20 to 100, or ten times that of $I^2$L. Thus base current in normally operating semiconductor transistors can be an order of magnitude less than base currents in inverse operating semiconductor transistors in order to provide the same collector current. Also a $\beta$ in the range of 50 is generally desired to insure stable, reproducible current conditions in a memory cell. Packing density is limited in $I^2$L due to limitations on the base width (see w in FIG. 2) of the lateral transistor.

To achieve high packing density, low standby current and low power dissipation, it is therefore highly desirable to provide a bipolar memory cell having no resistors in the basic cell structure, which is fed with power through the bit lines and which employs transistors operating in the normal or forward current mode.

Also known is integrated Schottky logic (ISL). J. Lohstroh in "ISL, a Fast and Dense Low-Power Logic, made in a Standard Schottky Process", *IEEE Journal of Solid State Circuits*, Vol. SC-14 No. 3, June 1979, discloses the schematic and cross sections of FIGS. 3 and 4, respectively. Similar structure is like numbered between FIGS. 3 and 4 for clarity.

In FIG. 3 a merged n-p-n transistor $T_5$ and p-n-p transistor $T_6$ are shown. $T_5$ is adapted to be switched between a saturated mode and an off condition by an input signal at 34. To avoid heavy saturation of $T_5$ (thus avoiding a large delay in switching to the off condition) Lohstrom employs clamping transistor $T_6$. $T_6$ drains off most of the $T_5$ input current as soon as the $T_6$ base-collector junction becomes forward biased. $T_5$ still goes into saturation but not as heavily. Transistor $T_5$ operates in the normal current mode. Schottky diodes 36, 38, 40 and 42 complete the basic ISL structure.

Lohstroh refines the device of FIG. 3 by forming $T_6$ as a composite of two p-n-p transistors $T_7$ and $T_8$ as shown in FIG. 4. By making the base of $T_7$ thinner than the base of $T_8$, the logic gate speed can be improved. Note that Lohstroh's basic design requires a gap d between buried N+ tub 44 and isolation barrier 46 in order for vertical p-n-p transistor $T_8$ to be formed.

Since ISL operates in the normal current mode, it affords easier processing and wider applicability than $I^2$L. ISL as proposed by Lohstroh, or as refined, has not heretofore been employed in bipolar memory cells.

SUMMARY OF THE INVENTION

The invention is an electromagnetic device, comprising: means for maintaining electrical current flowing in a portion thereof in one of two conditions and having first and second inputs; first and second unidirectional current conducting means; first access line having a first terminal wherein the first unidirectional current conducting means is electrically connected between the first terminal and the first input, and the first terminal is adapted to be electrically connected to a first electrical current source; and second access line having a second terminal wherein the second unidirectional current conducting means is electrically connected between the second terminal and the second input, and the second terminal is adapted to be electrically connected to a second electrical current source, so that the electrical current sources are the sole sources of electrical current for the electrical current flowing within a portion of the means for maintaining electrical current.

The means for maintaining the current in one of two conditions is conveniently provided as two n-p-n semiconductor transistors with their respective bases and collectors cross coupled. The first unidirectional current conducting means is connected between the first access (or bit) line and the base of one transistor with the second unidirectional current conducting means being connected between the second access (or bit) line and the base of the other transistor. A third access (or word) line can be connected to the emitters of the transistors. In this configuration, the transistors can be operated in the normal or forward current conducting mode with power (and electrical current) to the bistable regenerative circuit formed by the cross coupled transistors being supplied through the bit lines alone when current is being maintained in one of the two conditions. High packing density is provided by the absence of resistors within the cell.

Further refinements include a means for providing a very stable read signal to the word line by using an ISL gate.

The method of storing data in the memory cell wherein transistors are operated in the normal or forward current mode and power is supplied to the cell through the bit lines is also disclosed.

BRIEF DESCRIPTION OF THE DRAWINGS

FIG. 1 is a schematic of Wiedmann et al's prior art $I^2L$/MTL circuit.

FIG. 2 is a cross section showing the solid state structure of FIG. 1.

FIG. 3 is a schematic of Lohstroh's prior art ISL.

FIG. 4 is a cross section showing a solid state configuration for FIG. 3.

DESCRIPTION OF THE PREFERRED EMBODIMENT

Figure 5:
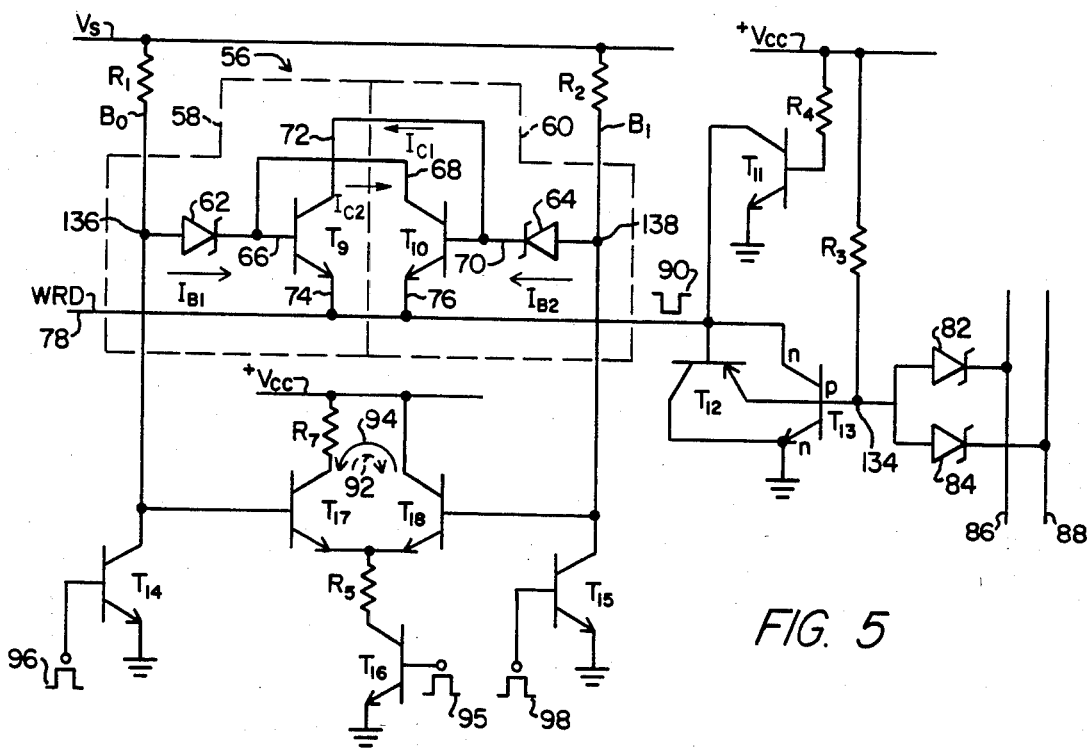
FIG. 5 is a schematic of a memory cell of the present invention, and supporting read and write circuitry as well as word line control circuitry which interfaces with an address decoder.

FIG. 5 indicates a schematic of the semiconductor memory cell 56 of the present invention. The two halves of cell 56, marked by dashed lines 58 and 60, are identical. Cell 56 includes two unidirectional current (current or electrical current as used herein shall mean conventional current) conducting means such as Schottky diodes 62 and 64, and transistors $T_9$ and $T_{10}$ (both n-p-n in this example). Base 66 of $T_9$ is cross coupled to the collector 68 of $T_{10}$. The base 70 of $T_{10}$ is cross coupled to the collector 72 of $T_9$. Emitters 74 and 76 of transistor $T_9$ and $T_{10}$, respectively, are connected in common to word line 78. The above described cross coupling of transistors $T_9$ and $T_{10}$ provides the basis of a bistable, regenerative electrical circuit. Such a bistable circuit is merely one example of a means for maintaining current flowing in a portion thereof in one of two conditions. Alternatively, transistors $T_9$ and $T_{10}$ are examples of first and second switching means.

The semiconductor region of Schottky diode 62 is connected to base 66 and the semiconductor region of Schottky diode 64 is connected to base 70. The metallized portion 80 (see FIG. 8) of diode 62 and the metallized portion (see $B_1$ in FIG. 6) of diode 64 are connected, respectively to bit (or access) lines $B_0$ and $B_1$.

Word (or access) line 78 is supplied with a reference voltage by transistor $T_{11}$. Transistors $T_{12}$ and $T_{13}$ and resistor $R_3$ provide an ISL gate which is connected to an address decoder (the decoder is shown in part as Schottky diodes 82 and 84, and logic gate input lines 86 and 88). Read and write functions for cell 56 are performed by $T_{14}$, $T_{15}$, $T_{16}$, $T_{17}$ and $T_{18}$. Generation of a reference voltage, the function of the ISL gate and the read, write and store modes of cell 56 will be described below.

The basic storage function of cell 56 occurs when one of transistors $T_9$ and $T_{10}$ is saturated and the other is off. For illustrative purposes, assume $T_9$ is on and $T_{10}$ is off. This will be defined as logic condition 1 (if $T_{10}$ were on and $T_9$ off, this would be logic 0). In logic condition 1, both junctions of $T_9$ are forward biased. Current will be flowing through Schottky diodes 62 and 64 (see $I_{B1}$ and $I_{B2}$), therefore Schottky diodes 62 and 64 are forward biased. Since $\beta$ for $T_9$ is greater than one, the current in the collector 72 of $T_9$ ($I_{C1}$) will be larger than $I_{B1}$. With $T_{10}$, off, $I_{C1}$ is very close to $I_{B2}$ and therefore the voltage drop across diode 64 is larger than the voltage drop across diode 62. This in turn allows for the base 66-emitter 74 junction of $T_9$ to be forward biased while the base 70-emitter 76 junction of $T_9$ is reverse biased. Cell 56 is thus in one of its two bistable states and will remain in that condition until $T_9$ is turned off and $T_{10}$ is turned on. Supply voltage $V_s$ resistors $R_1$ and $R_2$ and the barrier heights of the various PN junctions of diodes 62, 64, $T_9$ and $T_{10}$ will be appropriately chosen to allow the bistable, regenerative operation of cell 56.

In the storage mode, no input signal is provided to the base of n-p-n transistor $T_{13}$. $T_{13}$ is off and word line 78 is held at a reference voltage set by the voltage from the collector to emitter of Schottky n-p-n transistor $T_{11}$. $R_4$ is selected so that the base-emitter junction of $T_{11}$ is forward biased and $T_{11}$ is thus on to shunt current on word line 78 to ground during the storage mode.

For a read function, "row" and "column" signals are needed which uniquely designate cell 56. The row signal is provided along word line 78 and a column signal is provided through transistor $T_{16}$.

The voltage on word line 78 is dropped low by inputting a logic 1 signal to the base of $T_{13}$ through, for example, address decoder diodes 82 and 84. The standby or reference voltage on word line 78 is maintained by the collector-emitter voltage of $T_{11}$ ($T_{11}$ is kept on at all times by $V_{cc}$ and $R_4$). $T_{13}$ is designed to turn on with a logic 1 input to its base. When $T_{13}$ is on, the resulting current in the collector of $T_{13}$ overrides the reference voltage set by $T_{11}$ and sends a low voltage pulse 90 along word line 78. The collector-base voltage of $T_{11}$ is defined by the Schottky clamp on $T_{11}$. Clamping transistor $T_{12}$ limits the current in the collector-base diode of $T_{13}$ and thus defines the voltage drop which can be produced as pulse 90. By setting the forward bias voltage of the base-collector junction of $T_{12}$ and the collector-base clamp voltage of $T_{11}$ very close (e.g., within 100 to 200 mv) a very stable, reproducible word line read voltage (equal to the difference between these voltages, i.e., a difference in the 100 to 200 mv range) is provided as voltage signal 90.

When the voltage on word line 78 is dropped, $I_{B1}$, $I_{B2}$ and $I_{C1}$ increase (in our example of logic state 1). Bit line $B_1$ will experience a larger voltage change than the voltage change in bit line $B_0$ due to the larger voltage drop across diode 64 than the voltage drop across diode 62. Of course, if $T_2$ had been on, (i.e., logic condition 0) the voltage change in $B_0$ would be larger than the voltage change in $B_1$.

Thus, when the differential amplifier including $T_{16}$, $T_{17}$ and $T_{18}$ is activated, a differential input will be provided to the base regions of $T_{17}$ and $T_{18}$, generating a current flow in one of two directions depending on which base current is larger. For logic condition 1, current will flow in the collector of $T_{17}$ as indicated by arrow 92. For logic condition 0, current will flow in the collector of $T_{17}$ as indicated by arrow 94. These opposite directions of current flow will produce voltages of the same magnitude but opposite polarities in the load (e.g., $R_7$) of the differential amplifier. The differential amplifier is activated only if $T_{16}$ is on. $T_{16}$ is turned on by read pulse 95 input to $T_{16}$'s base. The pulse width of signal 95 is, for example, 5 nanoseconds.

To write a logic 1 or a logic 0 in cell 56, either transistor $T_{14}$ or $T_{15}$ are turned on by a write pulse, 96 or 98, respectively, to their respective bases. Turning transistors $T_{14}$ or $T_{15}$ on, shunts current from diodes 62 and 64 to ground through transistors $T_{14}$ or $T_{15}$, respectively. This in turn provides an insufficient voltage drop to keep diodes 62 or 64 forward biased. Thus, for example, if transistor $T_{15}$ is turned on, diode 64 will be reverse biased, collector current $I_{C1}$ of $T_9$ will drop to 0 or near 0 and no current will flow through $T_9$. $T_{14}$ remains off, however, so bit line $B_0$ is free to reach a current level controlled by $R_1$ and $V_s$. Diode 62 will be forward biased and $T_{10}$ will be turned on. Thus a logic 0 is written in cell 56.

To write a logic 1, $T_{15}$ remains off and $T_{14}$ is pulsed on. This will turn $T_9$ on and $T_{10}$ off by a process similar to that described above, which will write a logic 0 in cell 56.

Figure 6:
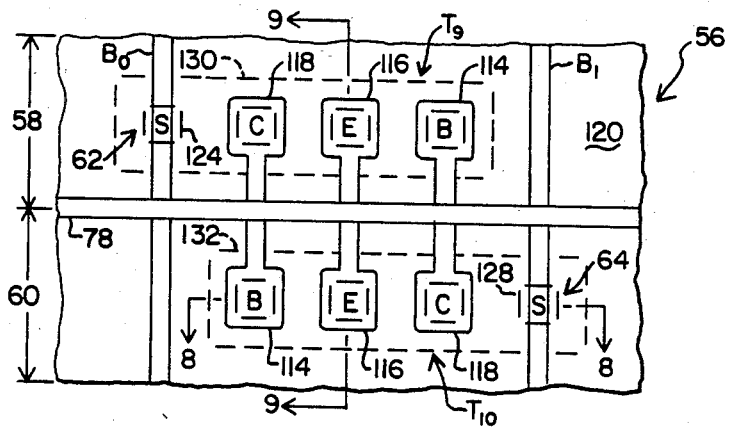
FIG. 6 is a plan view of a portion of an integrated circuit including the memory cell of the present invention.
Figure 7:
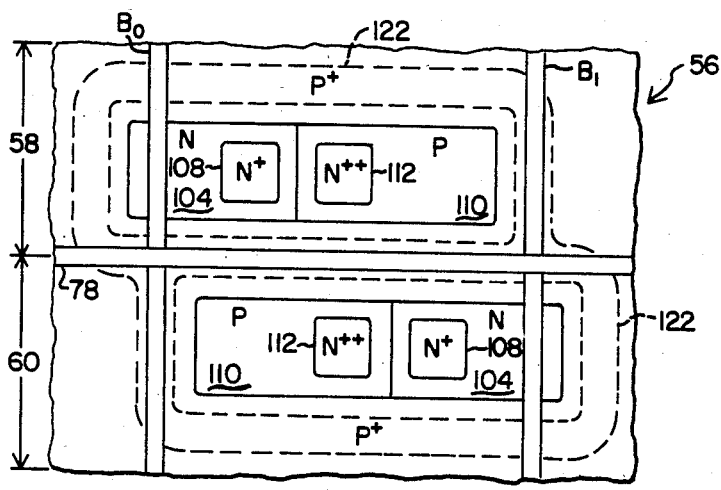
FIG. 7 is the same as FIG. 6 with some structure removed for clarification.
Figure 8:
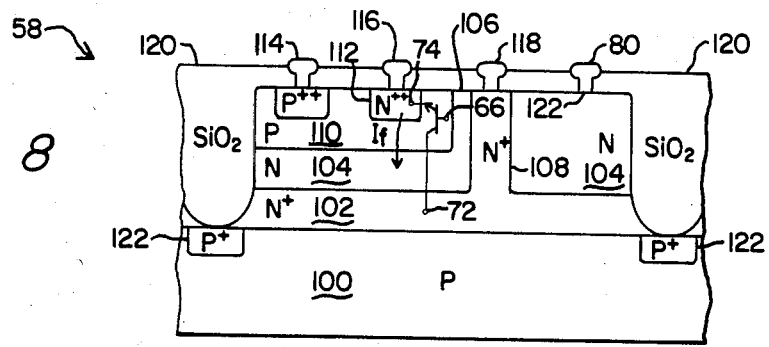
FIG. 8 is a cross section along line 8—8 of FIG. 6.
Figure 9:
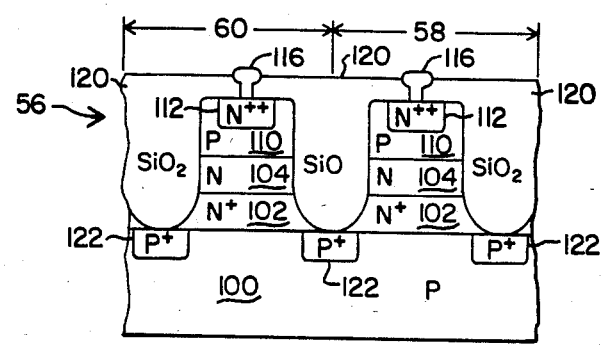
FIG. 9 is a cross section along line 9—9 of FIG. 6.

FIG. 6, 7 and 9 show various views of cell 56 as a portion of an integrated circuit (the remainder of which is not shown). FIG. 8 shows a cross section of half 58 of cell 56 along line 8—8 of FIG. 6. Similar structure in FIGS. 5 through 9 will be labeled the same for clarity.

As seen in FIG. 8, a substrate 100 of a semiconductor material doped with a conductivity type of a first kind (e.g., P type) has a first epitaxial layer 102 grown on a surface thereof. Layer 102 is doped with a heavy concentration of a conductivity type of a second kind (e.g., N+ doping). A second epitaxial layer 104 is grown on top of layer 102 and is doped with conductivity carriers of the second kind, but at a lower concentration than that of layer 102. A N+ diffusion 108 is provided from the upper surface 106 of layer 104 and extends to layer 102. A P type diffusion 110 is provided over a portion of surface 106 and extends from surface 106 to less than the thickness of layer 104. Diffusion 110 forms the base region of $T_9$. Finally, an N++ region 112 is diffused in P region 110 to form the emitter of $T_9$. Current $I_f$ shows the normal or forward direction of current flow in $T_9$.

Metallized contacts 114, 116 and 118 are provided to the base 110, collector contact diffusion 108 and emitter 112 regions of T9, respectively. An isolation region 120 (e.g., formed by SiO2) laterally electronically separates half 58 from half 60 and the other portions of the integrated circuit. A P+ guard ring 122 is shown in cross section in FIG. 8. Guard ring 122 is buried in substrate 100 and surrounds the bottom of each half 58 and 60 just below region 120.

A comparison of FIGS. 4 and 6 reveals that the space d is eliminated. Thus, clamping transistor $T_6$ (composed of $T_7$ and $T_8$) is eliminated. Therefore, if ISL is defined to include a clamping transistor, FIG. 6 and cell 56 does not strictly include ISL. Nevertheless, cell 56 does integrate Schottky diodes and transistors.

In FIG. 6, a plan view of cell 56 is provided including half 58 of FIG. 8. Similarly functioning structure in halves 58 and 60 are numbered alike in FIG. 6 for clarity. Bit lines $B_0$ and $B_1$ are shown in FIG. 6 as well as word line 78. Note that contact 80 of FIG. 8 is integral with $B_0$ above S in FIG. 6 and is enclosed by dashed line 124 which represents an opening through layer 120. Schottky diode 62 is formed by the interface 126 (see FIG. 8) of metallized contact 80 and N layer 104. Similary, Schottky diode 64 is included in opening 128 and SiO2 layer 120. Six other openings are shown as dashed lines but are unnumbered in FIG. 6. These other openings enclose the base, collector and emitters of $T_9$ and $T_{10}$ (which are further labeled by B, C and E).

Dashed lines 130 and 132 show the interface of SiO2 layer 120 and layer 102 for $T_9$ and $T_{10}$, respectively.

FIG. 7 is the same as FIG. 6 except that layer 120 above surface 106 and metallized contacts 114, 116, 118 and 80 are removed to expose surface 106. FIG. 9 is a cross section of cell 56 showing the isolation of halves 58 and 60 by layer 120.

Figure 10:
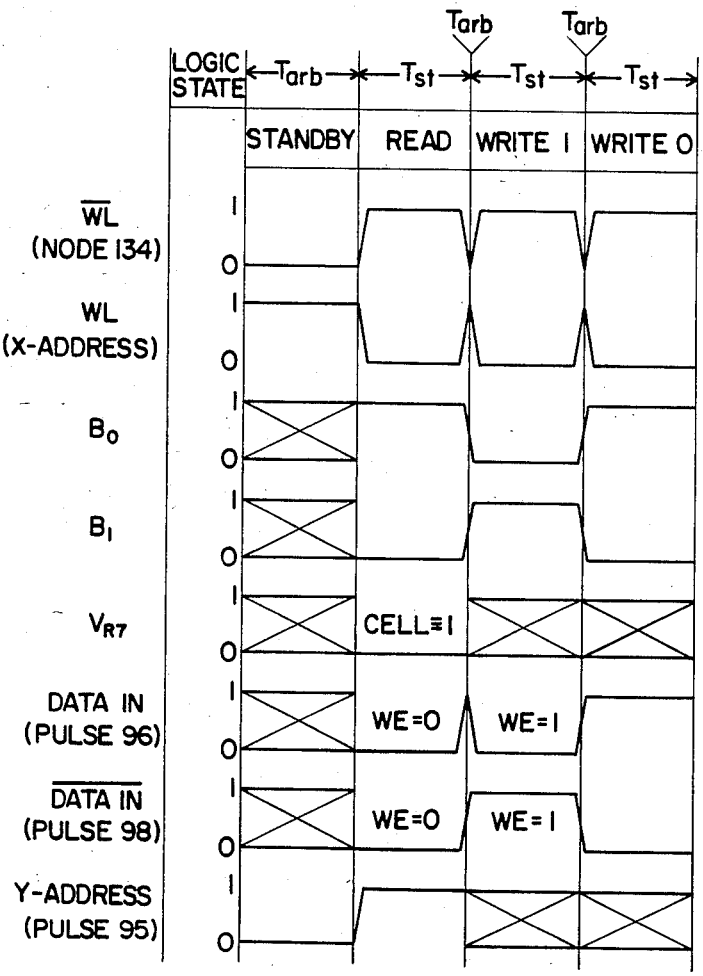
FIG. 10 is a timing diagram illustrating the operation of the circuit of FIG. 5.

FIG. 10 is a timing diagram indicating various voltage signals for the read operation of cell 56 when it is in logic state 1, and the writing of a 1 or a 0. All voltages are shown as 1 or 0 for each line. Depending on the particular design of the circuit, a voltage corresponding to a 1 or a 0 for one line may or may not equal a voltage corresponding to a 1 or a 0 on any other line. WL is the voltage at node 134 (i.e., the base of $T_{13}$, see FIG. 5).

In FIG. 10 Tarb indicates that the corresponding time interval is arbitrarily long. $T_{St}$ is the storage time of the means for maintaining current of FIG. 5. Unlike standard static memory cells wherein the stored data is maintained as long as power is supplied to the cell, (and thus will be maintained irrespective of the duration of a read pulse), data stored in cell 56 of the present invention could be lost if a read pulse exceeds a maximum time defined as $T_{St}$. In FIG. 5 a read pulse 90 on word line 78 allows the contents of cell 56 to be read. Pulse 90 affects the voltage at nodes 136 or 138 of bit lines $B_0$ and $B_1$, respectively. Therefore, other memory cells (not shown) of the same structure as cell 56 in the same column of a semiconductor memory (not shown) which are connected to bit lines $B_0$ and $B_1$ below cell 56, will have the power to their inputs reduced for the duration of pulse 90. The data stored in such other cells will be maintained for a short time due to capacitances and transient effects inherent with the establishment of charge distributions within a cell corresponding to a given logic state. $T_{St}$ will typically be on the order of 5 to 10 nanoseconds.

WE stands for "word enable". WE and associated circuitry is not shown. Such additional circuitry would be adapted to allow pulses 96 and 98 (i.e., Data IN and Data $\overline{IN}$, respectively) to be applied to $T_{14}$ and $T_{15}$, respectively (if WE=1) or block such pulses (if WE=0). For a read operation WE=0 since pulses 96 and 98 are always complementary and one desires both $T_{14}$ and $T_{15}$ to be off when a read operation is being performed.

From the description of the function of the circuit of FIG. 5, it is seen that cell 56 can be employed as one cell of a RAM.

What is claimed is:

1. A solid state memory device, comprising:
   means for maintaining electrical current flowing in a portion thereof in one of two conditions and having first and second inputs for receiving logic function signals;
   first and second unidirectional current conducting means;
   first and second electrical current sources,
   first access line for transmitting said logic function signals having a first terminal wherein said first unidirectional current conducting means is electrically connected between said first terminal and said first input, and said first terminal is electrically connected to said first electrical current source; and
   second access line for transmitting said logic function signals having a second terminal wherein said second undirectional current conducting means is electrically connected between said second terminal and said second input, wherein said second terminal is electrically connected to said second electrical current source, and wherein said first and second electrical current sources are the sole sources of electrical current for said electrical current flowing within a portion of said means for maintaining electrical current.

2. The device of claim 1 wherein said means for maintaining current is a bistable, regenerative electrical circuit.

3. The device of claim 2 wherein said bistable regenerative electrical circuit includes:
   a first semiconductor transistor having a first base, a first emitter, a first collector and wherein said first base is said first input; and
   a second semiconductor transistor having a second base, a second emitter and a second collector, wherein said second base is said second input, said first base is electrically connected to said second collector and said second base is electrically connected to said first collector.

4. The device of claim 3 further including:
   a third access line, wherein said first and second emitters are electrically connected to said third access line.

5. The device of claim 4 further including:
   means to hold the electrical current in said third access line substantially constant when it is desired to maintain said electrical current condition in said means for maintaining electrical current.

6. The device of claim 5 further including means to determine at selected times which of said two current conditions is being maintained in said means for maintaining electrical current.

7. The device of claim 6 further including means to define the difference in voltage on said third access line between the times when said means to determined which said two current conditions is being maintained is operative and inoperative, respectively.

8. The device of claim 7 wherein said means to define the difference in voltage, comprises:
   a Schottky clamped bipolar semiconductor transistor; and
   a transistor clamped bipolar semiconductor transistor.

9. A solid state memory device, comprising:
   a first solid state transistor having a first base, a first emitter, first collector and being adapted to operate in the normal current mode;
   a second solid state transistor having a second base, second emitter, a second collector and being adapted to operate in the normal current mode, and wherein said first base is electrically connected to said second collector and said second base is electrically connected to said first collector;
   first means for unidirectionally conducting current, said first unidirectional current conducting means being directly electrically connected to said first base;
   second means for unidirectionally conducting current, said second unidirectional current conducting means being directly electrically connected to said second base;
   first and second bit lines for transmitting logic function signals, said first and second bit lines having first and second terminals, respectively, wherein said first unidirectional current conducting means is electrically connected between said first terminal and said second base, and said second unidirectional current conducting means is electrically connected between said second terminal and said first base, and wherein said first terminal is electrically connected to a first current source and said second terminal is electrically connected to a second current source but no electrical current source is directly electrically connected to said first or second base.

10. The device of claim 9 wherein said first and second unidirectional current conducting means are first and second diodes, respectively.

11. The device of claim 9 wherein said first and second diodes are Schottky diodes.

12. The device of claim 9 further including:
   a word line electrically connected to said first and second emitters.

13. The device of claim 12 further including:
   means to hold the current in said word line substantially constant when it is desired to maintain said electrical current condition in said first and second transistors.

14. The device of claim 13 further including means to determine, at selected times, which of said two current conditions is being maintained in said means for maintaining electrical current.

15. The device of claim 14 further including means to define the difference in voltage on said third access line between the times when said means to determine which of said two current conditions is being maintained is operative and inoperative, respectively.

16. The device of claim 15 wherein said means to define the difference in voltage, comprises:
   a Schottky clamped bipolar semiconductor transistor; and
   a transistor clamped bipolar semiconductor transistor.

17. A method of maintaining a current condition in a memory cell having a bistable regenerative electrical circuit, said circuit including first and second transistors having first and second emitters, respectively, and first and second bases, respectively, said circuit having first and second bit lines, a word line and a standby voltage at which said circuit can remain in one of said two bistable states, comprising:

operating said first and second transistors in a normal current conducting mode;

allowing only unidirectional current flow between said first base and said first bit line, and between said second base and said second bit line; and providing said standby voltage to said first and second transistors through said first and second bit lines, respectively.

18. An electrical device, comprising:

first switching means having a first input and a first output;

second switching means having a second input and a second output, wherein said first output is directly electrically connected to said second input and said second output is directly electrically connected to said first input;

third switching means having a third input and a third output;

fourth switching means having a fourth input and a fourth output, wherein said third output is directly electrically connected to said fourth input and said fourth output is directly electrically connected to said third input;

first, second, third and fourth unidirectional current conducting means wherein said first unidirectional current conducting means is directly electrically connected to said first input, said second unidirectional current conducting means is directly electrically connected to said second input, said third unidirectional current conducting means is directly electrically connected to said third input and said fourth unidirectional current conducting means is directly electrically connected to said fourth input;

first access line having a first terminal wherein said first terminal is directly electrically connected to said first unidirectional current conducting means and said third unidirectional current conducting means, and wherein said first terminal is electrically connected to a first current source;

second access line having a second terminal wherein said second terminal is directly electrically connected to said second unidirectional current conducting means and said fourth unidirectional current conducting means, and wherein said second terminal is electrically connected to a second current source; and wherein no electrical current sources are directly electrically connected to said switching means.

19. The device of claim 18 wherein said first switching means is a first bipolar semiconductor transistor having a first base, first emitter and a first base, first collector, and said first base is said first input and said first collector is said first output;

said second switching means is a second bipolar semiconductor transistor having a second base, a second emitter and a second collector, and said second base is said second input and said second collector is said second output.

20. The device of claim 19 further including:

a third access line, wherein said first and second emitters are directly electrically connected to said third line.

21. A solid state memory, comprising:

first and second bit lines;

first and second means for supplying current to said first and second bit lines, respectively;

a plurality of word lines;

a group of memory cells, wherein said group includes at least two of said cells, each of said cells is accessed by said first and second bit lines and each of said cells includes:

first and second bipolar transistors wherein said first and second transistors each have a base region, an emitter region and a collector region, the base of said first transistor being directly electrically connected to the collector of said second transistor, the collector of said second transistor being directly electrically connected to the base of said first transistor, so that said first and second bipolar transistors form a bistable regenerative circuit;

first and second diodes wherein said first diode is directly electrically connected to and between the base of said first transistor and said first bit line, and said second diode is directly electrically connected to and between the base of said second transistor and said second bit line;

wherein one and only one of said word lines is directly electrically connected to the emitters of said first and second transistors; and wherein said first and second means for supplying current provides the current for said bistable regenerative circuits in all of said memory cells of said group.

22. The memory of claim 21, further comprising:

additional of said groups of said memory cells, wherein said groups of memory cells are arranged in rows and columns and wherein said first and second bit lines provide the current for said bistable regenerative circuits in all of said memory cells in one of said rows or one of said columns.

* * * * *

UNITED STATES PATENT AND TRADEMARK OFFICE
CERTIFICATE OF CORRECTION

PATENT NO. : 4,601,016
DATED : JULY 15, 1986
INVENTOR(S) : PETER C. ROBERTS

It is certified that error appears in the above-identified patent and that said Letters Patent is hereby corrected as shown below:

In column 7, line 60, delete "determined" and insert in lieu thereof --determine--.

In column 7, line 61, insert --of-- after "which".

In column 9, line 51, delete "first base," (second occurrence).

Signed and Sealed this

Thirteenth Day of January, 1987

Attest:

DONALD J. QUIGG

*Attesting Officer*     *Commissioner of Patents and Trademarks*